(12) United States Patent
Grant et al.

(10) Patent No.: US 11,791,831 B1
(45) Date of Patent: Oct. 17, 2023

(54) MODULAR REDUNDANT THRESHOLD CIRCUIT AND METHOD

(71) Applicant: Apogee Semiconductor, Inc., Plano, TX (US)

(72) Inventors: David A. Grant, London (GB); Mark Hamlyn, Murphy, TX (US)

(73) Assignee: Apogee Semiconductor, Inc., Plano, TX (US)

( * ) Notice: Subject to any disclaimer, the term of this patent is extended or adjusted under 35 U.S.C. 154(b) by 0 days.

(21) Appl. No.: 18/320,644

(22) Filed: May 19, 2023

(51) Int. Cl.
| H03M 7/00 | (2006.01) |
| H03M 7/34 | (2006.01) |
| H03M 1/12 | (2006.01) |
| H03M 1/06 | (2006.01) |
| H03K 19/08 | (2006.01) |
| H03K 19/23 | (2006.01) |

(52) U.S. Cl.
CPC ...... *H03M 1/0687* (2013.01); *H03K 19/0813* (2013.01); *H03K 19/23* (2013.01)

(58) Field of Classification Search
CPC .. H03M 1/0687; H03K 19/0813; H03K 19/23
See application file for complete search history.

(56) References Cited

U.S. PATENT DOCUMENTS

| 3,305,830 | A | * | 2/1967 | Constantine, Jr. ........................ H03K 19/00392 326/35 |
| 6,667,520 | B1 | | 12/2003 | Fulkerson |
| 6,906,388 | B2 | | 6/2005 | Fulkerson |
| 6,910,173 | B2 | * | 6/2005 | Mitra .................... G06F 11/184 714/760 |
| 6,963,217 | B2 | * | 11/2005 | Samudrala ......... H03K 19/1778 326/11 |
| 8,390,327 | B1 | | 3/2013 | Parkhurst et al. |
| 9,191,009 | B1 | | 11/2015 | Clark et al. |

(Continued)

OTHER PUBLICATIONS

Wu, H., Jin, G., and Zhuang, Y., "Design and analysis of a SET tolerant single-phase clocked double-tail dynamic comparator," Analog Integrated Circuits and Signal Processing (2022) vol. 112, pp. 367-377, https://doi.org/10.1007/s10470-022-02054-7.

(Continued)

*Primary Examiner* — Jean B Jeanglaude
(74) *Attorney, Agent, or Firm* — Gregory A. Magel

(57) ABSTRACT

Systems and methods for fault-tolerant threshold circuits used in converting an analog input to a single-bit digital output employ N-modular redundancy of either inverting or non-inverting threshold circuits whose inputs are connected to a single input, and apply majority voting of their outputs to provide correction of transient or permanent faults in up to floor[(N−1)/2] of the individual threshold circuits. Using summation to perform analog majority voting averages the N threshold circuit outputs and provides resilience to single-event transients, but may exhibit an output characteristic having intermediate voltage levels. A digital majority voter having N inputs connected to the outputs of N threshold circuits restores well-defined logic levels and clean hysteresis for Schmitt trigger threshold circuits. A single point of failure at the digital majority voter may be eliminated using an analog majority voter to sum the outputs of three or more redundant digital majority voters.

20 Claims, 9 Drawing Sheets

(56) References Cited

U.S. PATENT DOCUMENTS

| | | |
|---|---|---|
| 10,715,143 B1 | 7/2020 | Alessandro et al. |
| 11,342,915 B1 | 5/2022 | Ross |
| 2015/0318060 A1* | 11/2015 | Wolpert ................ G06F 11/008 714/719 |

OTHER PUBLICATIONS

Fairchild Semiconductor, "CMOS Schmitt Trigger—A Uniquely Versatile Design Component," Application Note 140, Jun. 1975, https://www.onsemi.cn/pub/collateral/an-140cn.pdf.

* cited by examiner

MODULAR REDUNDANT THRESHOLD CIRCUIT AND METHOD

BACKGROUND OF THE INVENTION

1. Field of the Invention

The present invention relates generally to integrated circuits, and, more particularly, to fault-tolerant integrated circuits having high resilience to single-event effects.

2. Description of the Related Art

Circuits that provide a digital output level by comparing an analog input to a reference threshold are used for a variety of functions including analog-to-digital conversion, clock generation, and sensing. A threshold circuit converts incoming data that may be an analog signal or a corrupted digital signal into a well-defined digital output level. Such threshold circuits can have a single threshold, as in a comparator, or separate low and high thresholds, in the cases of a comparator with hysteresis or a Schmitt trigger. Threshold circuits such as comparators may operate continuously, or may be clocked in order to perform an evaluation of the input level at a specific time to provide a digital output as part of a synchronized digital system. Schmitt triggers and comparators with hysteresis are designed to output full-swing "clean" digital signals when presented with noisy input signals or slow input transitions, preventing intermediate voltages at the input from affecting the output, and without the output switching rapidly back and forth from noise around a single threshold.

Systems used in harsh environments or high-reliability critical applications may incorporate fault tolerance using methods such as various forms of redundancy. Fault tolerance using redundancy may be implemented at various levels in such systems, from high-level system or subsystem replication and sparing, and software error correction techniques, down to the gate or even device level in integrated circuits used in the systems. Spacecraft and nuclear power exemplify applications having strict requirements for both high reliability and operation in harsh environments; circuits used in such applications may encounter extreme temperatures and ionizing radiation.

Ionizing radiation can cause both permanent degradation of semiconductor devices due to dose effects, and also cause transient effects due to dose-rate effects and single-event effects. In single-event effects (SEEs), impinging ionizing particles, such as cosmic rays, heavy ions, or protons, generate charge that causes temporary voltage glitches (known as single-event transients or SETs) leading to a transient change in an analog level or logic state. Single-event effects of several types resulting from single-event transients may be analog or digital, and while they may be nondestructive, may result in errors or other various forms of functional disruption of a system.

Integrated circuits for application in environments having high levels of ionizing radiation may be fabricated using special processes, but there is a current emphasis on using specialized IC design techniques (Radiation Hardening By Design or RHBD) instead of processes to improve radiation hardness. RHBD layout techniques, including redundancy, may be applied to advanced commercial IC technologies that have higher performance than dedicated rad-hard processes, at the expense of some circuit area and some compromise in performance such as speed and power consumption. Specialized circuit designs and layout techniques exist for reducing susceptibility to radiation-induced errors. RHBD prevents the need for development of new IC processes or for the fabrication of entire IC wafers using a special rad-hard process, which can reduce the performance of portions of ICs within the wafer that do not require the same level of rad-hardness.

Threshold circuits are as susceptible to faults due to single-event effects as other analog and digital integrated circuit functions, and can supply an erroneous output signal in response to single-event transients. There is thus a need for circuits and methods that provide robust resilience to transients and other types of failures and mitigate single-event effects, while providing a well-defined digital output response to a given analog input level, in order to operate reliably and predictably in a high-radiation environment.

SUMMARY OF THE INVENTION

The present invention addresses the need for radiation-hardened functional circuits that incorporate various types of threshold circuits. Threshold circuits accept an analog or digital input signal and produce an output logic signal having well-defined digital levels, and include such circuits as Schmitt triggers, continuous and clocked comparators, and comparators with hysteresis. The present invention provides circuits and methods to implement the functions of such threshold circuits while exhibiting improved resilience to transient single-event effects or other subcircuit failures. Embodiments of circuits and methods according to the present invention provide well-defined and error-free digital output signals with resilience to various failures by applying N-modular redundancy techniques that have been adapted for the specific characteristics of these types of circuits. Examples are given for implementation in CMOS integrated circuit technology.

More specifically, the present invention provides a modular redundant circuit for use in an integrated circuit, having a number $N \geq 3$ of redundant threshold circuits, each having an input connected to a common input node, and each having an output connected to a majority voter circuit, with the output of the majority voter providing a valid output logic signal at an output node corresponding to a voltage at the input node that would be generated by a properly-operating threshold circuit, accommodating failures including transient or permanent errors in up to $\text{floor}[(N-1)/2]$ of the threshold circuits. In some embodiments, the number N of threshold circuits may be odd, in order to prevent ties from occurring at the majority voter. In some embodiments, the input node or output node or both may be connected to an external pad of the integrated circuit. In some embodiments, the majority voter circuit may be an analog majority voter, and in some embodiments, the majority voter circuit may be a digital majority voter. Embodiments employing an analog majority voter provide resilience to single-event effects for any type of threshold circuit, whereas embodiments using a digital majority voter additionally provide well-defined logic levels for threshold circuits having hysteresis.

In some embodiments, the majority voter circuit may be implemented using a number $M \geq 3$ of redundant digital majority voters, each having N voter inputs connected to the outputs of the N threshold circuits, and an analog majority voter having M analog voter inputs connected to the M digital voter outputs, in order to eliminate a single point of failure that could occur using a single digital majority voter.

The number M of digital majority voters may be odd to prevent the possibility of a tie occurring at the analog majority voter.

In some embodiments, an integrated circuit may include a semiconductor substrate having a functional circuit formed on the surface; at least one modular redundant threshold circuit that may include an input node, a number N≥3 of threshold circuits each having an input connected to the input node, and each having an output connected to an input of a majority voter circuit having a voter output connected to an output node and providing an output logic signal; and at least one pad usable for connection to external circuitry. In some embodiments, the number N of threshold circuits may be odd in order to prevent ties from occurring. In some embodiments, either the input node or the output node or both may be connected to a pad of the integrated circuit. In some embodiments, the integrated circuit may include a fault detection circuit connected to the modular redundant threshold and configured to provide a signal indicating that an error or failure is occurring, or has occurred, in some portion or portions of the modular redundant threshold circuit, and optionally report in which portion of the modular redundant threshold circuit an error or failure occurred.

In some embodiments, a method for generating an output logic signal may include providing an input signal, applying the input signal to a number N≥3 of threshold circuits, and performing a majority voting operation on the individual output signals of the threshold circuits. In some embodiments, the number N of threshold circuits may be odd in order to prevent ties from occurring. In some embodiments, the majority voting operation may be an analog majority voting operation, and in some embodiments, the majority voting operation may be a digital majority voting operation. In some embodiments, the step of performing a majority voting operation may comprise providing M≥3 digital majority voters, applying the output signals from the N threshold circuits to each of the M digital majority voters, and performing an analog majority voting operation on the M digital majority outputs to generate the output logic signal. The number M of digital majority voters may be odd to prevent the occurrence of ties.

Other features and advantages of the present invention will be apparent to those skilled in the art upon reference to the following detailed description taken in conjunction with the accompanying drawings, which are to be understood to be exemplary and explanatory, and are intended to provide further explanation of the invention as claimed.

DETAILED DESCRIPTION OF THE PREFERRED EMBODIMENTS

The following Detailed Description is merely exemplary in nature and is not intended to limit the various embodiments or the application and uses thereof. Furthermore, there is no intention to be bound by any theory presented in the preceding background or the following detailed description. The techniques and structures described below may be applied in fields and applications beyond those specified here as examples, and the disclosed invention is therefore not to be considered limited to the applications and examples used here for the sake of explaining its principles of operation.

Each signal described herein may be designed using positive or negative logic, where negative logic can be indicated by a bar over the signal name or "_BAR" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals, and therefore in alternate embodiments, those signals described as positive logic signals may be implemented as negative logic signals, and vice versa. As is known by those skilled in the art, combinational logic performed on opposite-polarity logic signals may be implemented equivalently in alternate embodiments using De Morgan's theorem.

Threshold circuits are designed to accept an analog input voltage or a corrupted or weak digital input signal and to output a well-defined (valid) digital logic signal. Examples of types of threshold circuits that may be used in embodiments include Schmitt triggers, inverting Schmitt triggers (Schmitt inverters), and various types of comparators including continuous-time comparators without or with hysteresis, and clocked comparators, also called dynamic or latched comparators. Such threshold circuits essentially perform a single-bit quantization (analog-to-digital) function.

Figure 1:
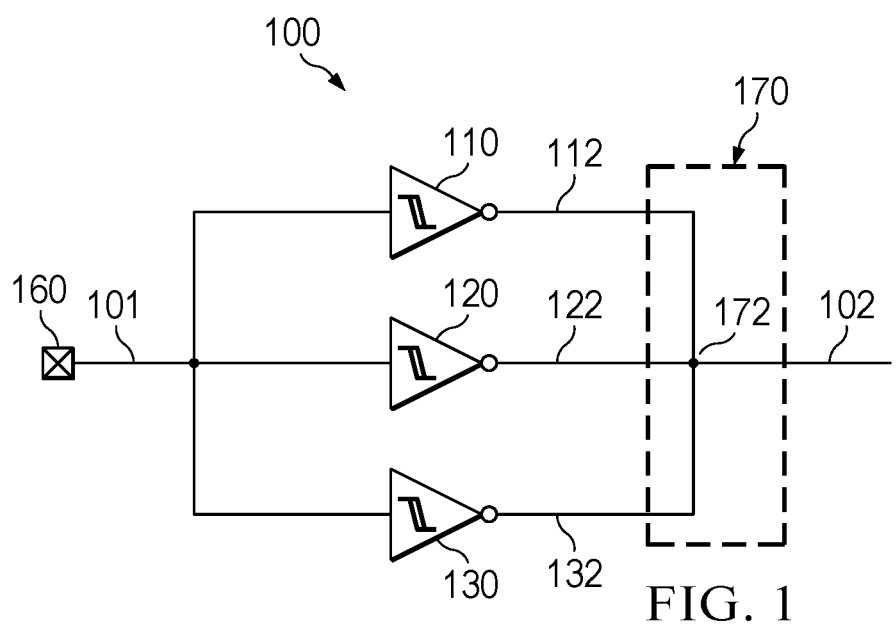
FIG. 1 is schematic circuit diagram of a triple modular redundant threshold circuit using inverting Schmitt triggers and analog majority voting.

FIG. 1 shows a schematic circuit diagram of a first embodiment of a modular redundant threshold circuit 100 according to the present invention. In this triple modular redundant example, an input node 101 is connected to the inputs of three redundant threshold circuits 110, 120, and 130. In the present context, the term "redundant" will be understood to refer to substantially identical modules, in the sense that they are expected to function the same in terms of providing the same output signal in response to the same input signal. If circuit 100 is fabricated in an integrated circuit technology, threshold circuits 110, 120, and 130 may be implemented using identical devices and layouts in nearby portions of an integrated circuit substrate, so that their electrical characteristics may be closely matched. Input node 101 may optionally supply an input signal from a source external to an integrated circuit, as indicated schematically in FIG. 1 by input pad 160; or an input signal may arise internal to an integrated circuit containing circuit 100, in which case input node 101 may be an internal node in the integrated circuit. When presented by the same input signal, threshold circuits 110, 120, and 130, having matched electrical characteristics, will normally produce output signals at their respective outputs 112, 122, and 132 that are substantially equal. In CMOS, this means that the output voltages from threshold circuits 110, 120, and 130 will be the same for a given input voltage at input node 101. In the embodiment shown in FIG. 1, threshold circuits 110, 120, and 130 are shown as Schmitt inverters, in which a high input voltage results in a low output voltage, with hysteresis characteristics to be described later, but it will be understood by those skilled in the art that the principles of the present invention also apply to other types of threshold circuits.

Single-event transients (SETs) or other failures may result in an erroneous output signal from an individual threshold circuit 110, 120, or 130. Using a majority voter 170 together with three or more redundant threshold circuits permits a correct signal to be produced at output node 102 despite an error in one of threshold output signals 112, 122, or 132. The number N of threshold circuits must be at least three to enable a majority. A tie may be prevented by using any odd number N greater than or equal to three redundant threshold circuits. Majority voting is possible using N=4 or a greater even number, although ties are then possible. If it is determined for a particular application that the probability is acceptably low for an error or failure to simultaneously occur in half of the threshold circuits, then an even number N greater than 3 of threshold circuits may be used.

Majority voter 170 in FIG. 1 represents a simple analog majority voter that is implemented by simply connecting the outputs 112, 122, and 132 of threshold circuits 110, 120, and 130 to a summing node 172 that functions as the voter output and is connected directly to output node 102. When threshold circuits 110, 120, and 130 are matched and have substantially equal output impedances, and summing node 172 is connected to a relatively high-impedance node such as transistor gate in a CMOS input, then a failure (such as a SET) in one of the threshold circuits will create a voltage divider that pulls the voltage of summing node 172 to an intermediate voltage at most approximately one-third of the way from the full logic swing, but the two correct threshold circuits will dominate and can still hold the output node 102 at a logic level that is considered valid. In the common case of a very short-duration single-event transient, the capacitance at summing node 172 may prevent the voltage at output node 102 from reaching even this one-third point; and using a number N greater than three threshold circuits will result in single errors causing an even smaller change in the output level, so that there is a correspondingly lower probability of either an incorrect or an invalid logic level at output node 102 than for N=3. Output node 102 may be an internal node in an integrated circuit, which in CMOS may be connected to high-impedance inputs such as the gates of MOS transistors, or it may be connected to an output pad (not shown) of the IC, if threshold circuits 110, 120, and 130 have sufficient output drive strength (current drive capability). If additional current drive is required, individual buffers (not shown) may be connected between outputs 112, 122, and 132 and summing node 172. Using individual buffers before summing at node 172 is preferable to using a single buffer between summing node 172 and output node 102, in order to prevent a possible single point of failure due to, e.g., a SET occurring in a buffer.

It can be seen from the foregoing discussion that analog majority voting is a simple method to implement redundancy and SET resilience in a CMOS or similar technology circuit having low to moderate output impedances and high input impedances. But in some applications, the fact that threshold circuits 110, 120, and 130 are not identical—even if they are carefully and identically designed, and positioned close to each other within an IC—can result in nonideal behavior of a modular redundant threshold circuit 100 using analog majority voting. As a specific example, with (inverting) Schmitt trigger threshold circuits as in FIG. 1, the positive-going thresholds may not be identical between the N threshold circuits, nor may be the negative-going thresholds. Variations in Schmitt threshold voltages may result from various unintended imperfections in electronic devices; in modern silicon submicron CMOS IC processes, the main sources of variability may be statistical variation in doping concentrations in wells and polysilicon gates, followed by lithographic imperfections and gate oxide thickness variations. The effect of such gate-to-gate differences in Schmitt threshold voltages will be described now in reference to FIGS. 2A-2D.

Figure 2A:
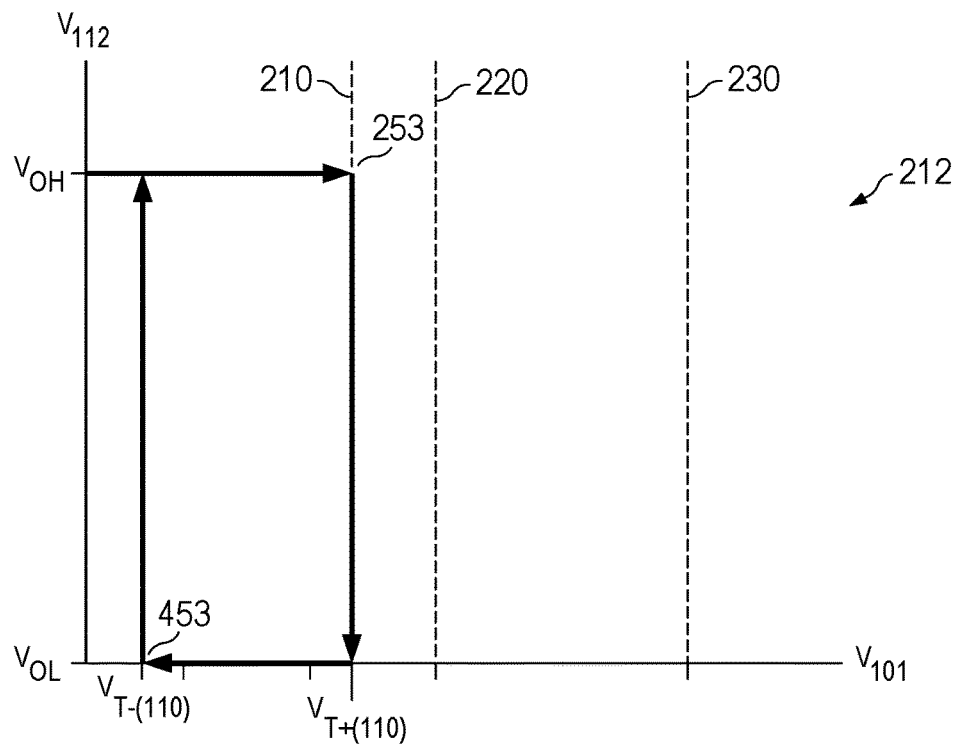
FIGS. 2A-2D are plots of output vs. input voltage characteristics used to describe the operation of the circuit shown in FIG. 1.

Referring now to FIG. 2A, a plot 212 illustrates the hysteretic voltage response of an isolated inverting voltage-mode Schmitt trigger 110. Plot 212 shows output voltage $V_{112}$, the voltage at output 112 of Schmitt trigger threshold circuit 110, as a function of the voltage $V_{101}$ at its input (i.e., the terminal of threshold circuit 110 that is connected to input node 101). Plot 212 assumes now for the sake of explanation that threshold circuit 110 is isolated, i.e., that node 112 is temporarily disconnected from other loads including the outputs of the other threshold circuits 120 and 130, and thus illustrates the behavior of threshold circuit 110 operating independently. As input voltage $V_{101}$ is swept up from zero, Schmitt inverter output 112 stays at a logic HIGH voltage level $V_{OH}$ until input voltage $V_{101}$ reaches positive-going threshold $V_{T+(110)}$, also indicated for further reference by vertical dashed line 210, at which input voltage the output voltage $V_{112}$ makes a transition from positive-going transition point 253 down to a logic LOW output voltage level $V_{OL}$, where it stays for higher values of input voltage $V_{101}$. Positive-going thresholds for threshold circuits 120 and 130 are also included for comparison and indicated by vertical dashed lines 220 and 230, respectively. For downward-going input voltages, the output voltage level remains at $V_{OL}$ until negative-going threshold $V_{T-(110)}$ is reached at negative-going transition point 453, at which point output voltage $V_{112}$ transitions to a logic HIGH output voltage level $V_{OH}$ where it remains for lower values of input voltage Vim, or until the input voltage again exceeds positive-going threshold $V_{T+(110)}$. (For clarity, vertical dashed lines corresponding to negative-going thresholds are omitted.) The function of a Schmitt trigger is to produce a valid unambiguous logic output signal when presented with noisy signals or slow input transitions at its input. The hysteretic characteristic just described is standard for single Schmitt triggers (in this case inverting), and it would be preferable for a radiation-hardened Schmitt trigger to exhibit this same type of behavior with a simple hysteresis response, i.e., having single positive-going and negative thresholds, and producing well-defined output logic levels when presented with intermediate input voltages that may have noise of an amplitude smaller than the voltage difference between the negative-going and positive-going threshold voltages. [Note that the voltage plots 212, 222, 232, and 252 in FIGS. 2A-2D are schematic, and it will be understood that the input-output characteristics of real threshold circuits will not display perfectly vertical nor horizontal lines, nor perfectly sharp corners such as 253, 254, 255, 453, 454, and 455 like those drawn herein for explanatory purposes.]

Figure 2B:
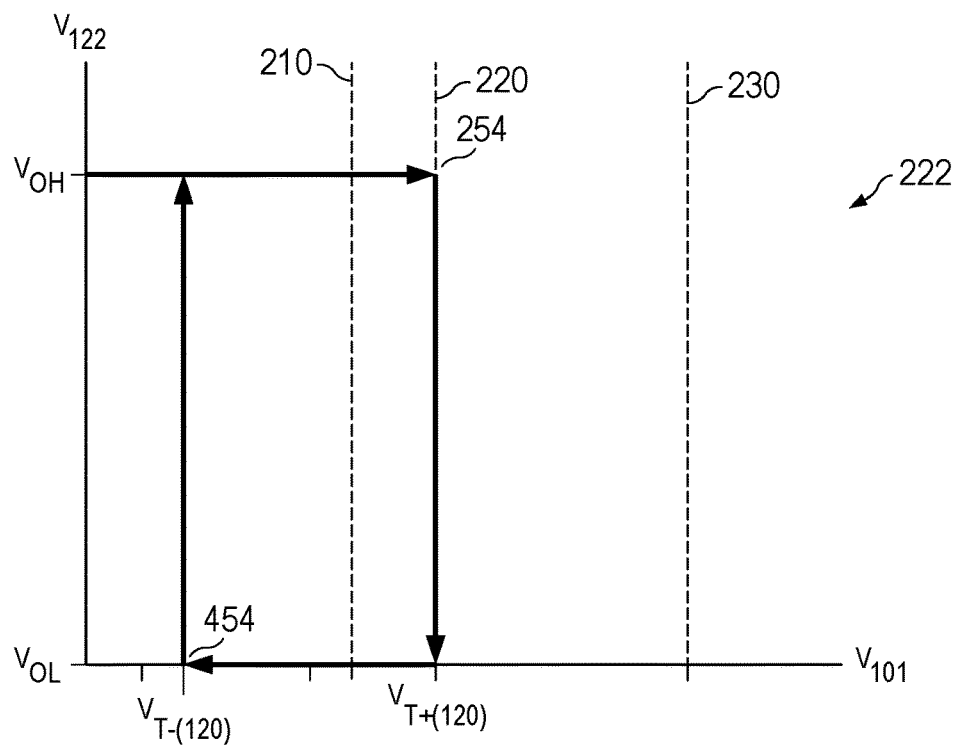
Figure 2C:
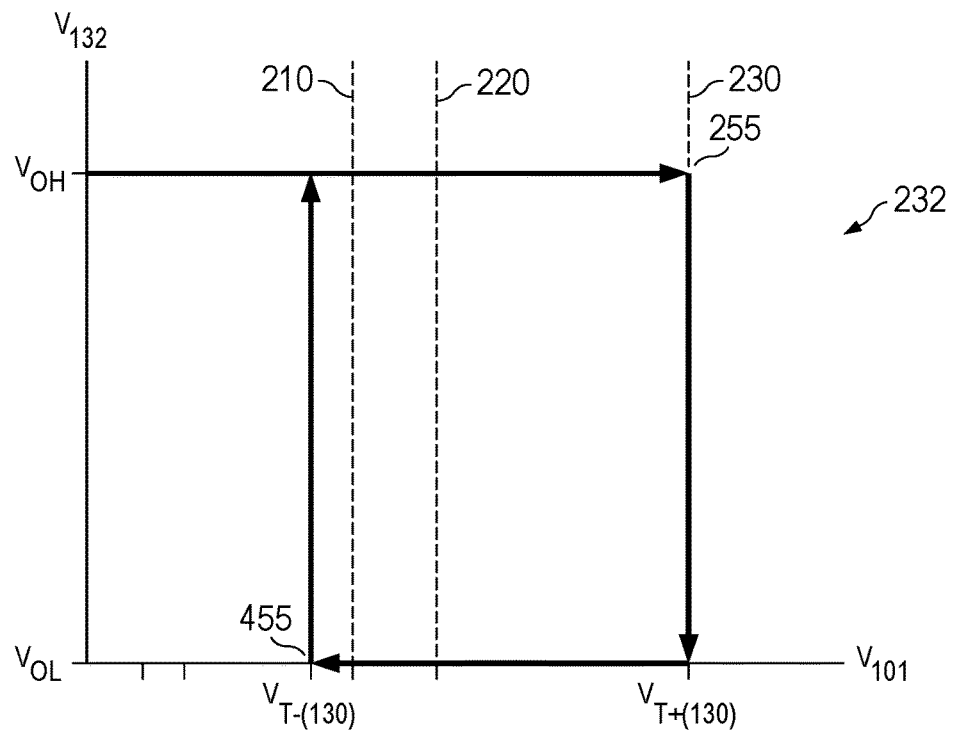

FIGS. 2B and 2C present similar plots 222 and 232 of the output voltages $V_{122}$ and $V_{132}$ for Schmitt trigger threshold circuits 120 and 130, respectively. In FIG. 2B, it can be seen that transitions for an independent and isolated threshold circuit 120 would occur at positive-going threshold $V_{T+(120)}$, additionally indicated by vertical dashed line 220 and transition point 254, and at negative-going threshold $V_{T-(120)}$ with associated transition point 454. Similarly, in FIG. 2C, transitions for an isolated threshold circuit 130 would occur at positive-going threshold $V_{T+(130)}$, additionally indicated by vertical dashed line 230 and transition point 255, and at negative-going threshold $V_{T-(130)}$ with its associated transition point 455. For the sake of this example, the magnitudes of the differences between the threshold voltages for the three threshold circuits have been greatly exaggerated relative to the difference between the input logic voltage levels, and both negative-going and positive-going thresholds have arbitrarily been chosen to lie in increasing order for threshold circuits 110, 120, and 130. In real integrated circuits, the thresholds would likely be more closely matched, and the negative-going thresholds for the associated threshold circuits might not increase in the same order as their positive-going thresholds.

Figure 2D:
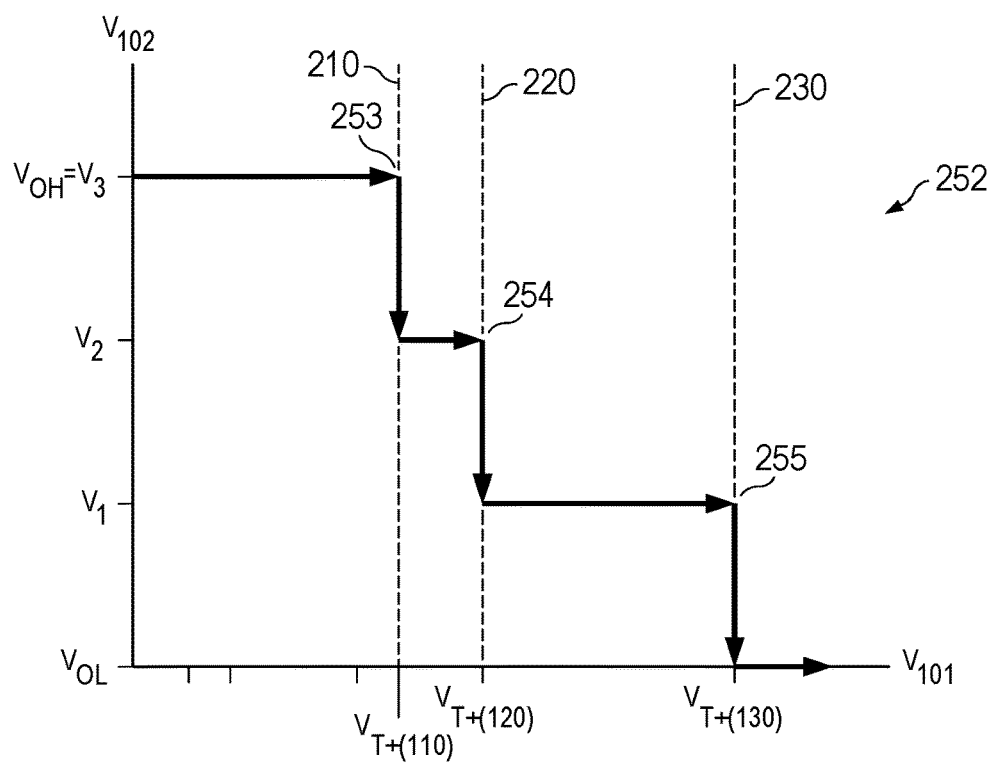

FIG. 2D shows a plot 252 of an overall input characteristic for embodiment 100 of a modular redundant threshold circuit, plotting the voltage $V_{102}$ at output node 102 for the case of analog majority voting using summing node 172 with three Schmitt inverters as in FIG. 1. For clarity, only the positive-going portion of the hysteresis curve is shown. When Schmitt trigger threshold circuits 110, 120, and 130 are matched, to the extent that they have approximately equal output impedances, and their outputs are connected together at summing node 172, the voltage at output node 102 exhibits a stepped response as shown, as input voltage $V_{101}$ is swept from low to high levels. Namely, voltage $V_{102}$ for the redundant Schmitt inverter with analog majority voting starts at the full HIGH logic level $V_3=V_{OH}$, and makes a first transition at $V_{T+(110)}$ (dashed line 210) and transition point 253 down to a voltage level $V_2$ that is approximately one-third of the way down to the LOW logic level $V_{OL}$; at $V_{T+(120)}$ (dashed line 220), a second transition occurs at 254 down to $V_1$, which is two-thirds of the way down to $V_{OL}$; and finally, when input voltage $V_{101}$ crosses $V_{T+(130)}$ (dashed line 230), a final third transition occurs at transition point 255 down to a full LOW logic level $V_{OL}$. Note that transition points 253, 254, and 255 in the overall input-output characteristic occur at the same three input threshold voltages as those for the independently-operating Schmitt triggers 110, 120, and 130, respectively, but at intermediate output voltage levels $V_3$, $V_2$, and $V_1$ between $V_{OH}$ and $V_{OL}$ that are determined by the loading of the Schmitt trigger outputs by each other and any other loads associated with output node 102. A similar stepped response (not shown) would occur in the downward direction at negative-going thresholds $V_{T-(130)}$, $V_{T-(120)}$, and $V_{T-(110)}$, in sequential order as $V_{101}$ is decreased, and transition points 455, 454, and 453 would apply in sequence. Although such a response is nominally hysteretic, it undesirably includes intermediate output voltage levels that are not well-defined logic levels, although they might be interpreted by following circuitry as valid levels. Thus, although the analog majority voting by voter 170 prevents errors in individual Schmitt triggers from producing an incorrect output logic level, a clean hysteretic response with single transitions between full logic levels is not provided using the circuit of FIG. 1.

Figure 3A:
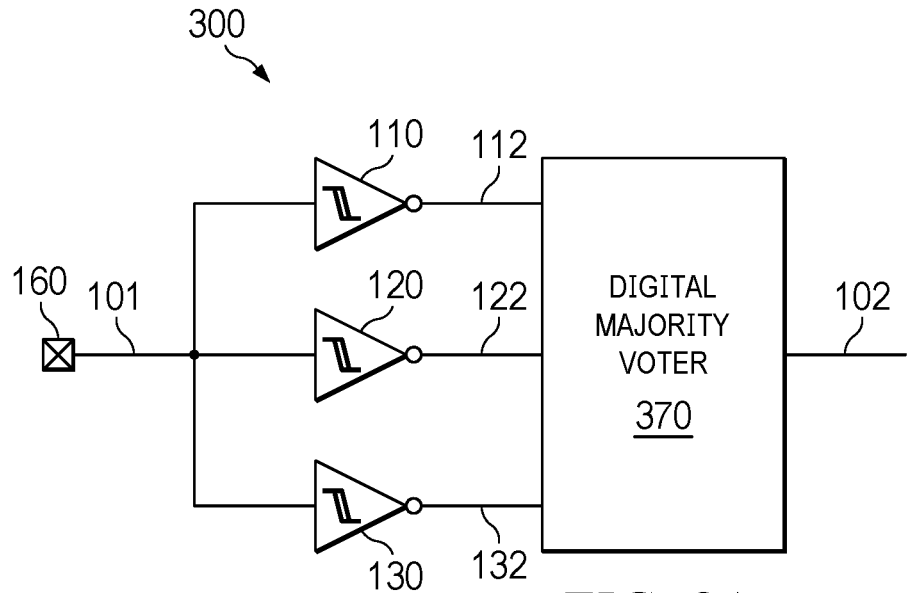
FIG. 3A is a schematic circuit diagram of a triple modular redundant Schmitt threshold circuit using a digital majority voter.

For some types of threshold circuits such as Schmitt triggers, embodiments using digital majority voting, instead of analog majority voting, may result in a more well-defined input-output characteristic for a modular redundant threshold circuit. The number N of redundant threshold circuits may be three or greater, and may be chosen to be an odd number to avoid the possibility of a tie vote occurring. Referring now to FIG. 3A, a schematic circuit diagram for a triple modular redundant Schmitt threshold circuit 300 using a three-input digital majority voter 370 is shown. Similar to modular redundant circuit 100 in FIG. 1, an input node 101 is connected to redundant threshold circuits 110, 120, and 130 and to an optional input pad 160. Respective outputs 112, 122, and 132 of threshold circuits 110, 120, and 130 are each connected to a respective input of digital majority voter 370. Digital majority voter 370 produces an output signal at output node 102 that is a valid logic signal reflecting the majority of threshold circuit outputs 112, 122, and 132; that is, for the case of triple redundancy, if at least two of signals 112, 122, and 132 are HIGH, then the output of digital majority voter 370 will be HIGH, and if at least two of signals 112, 122, and 132 are LOW, then the output of digital majority voter 370 will be LOW. (It will be apparent to those skilled in the art that embodiments using an inverting version of digital majority voter 370, providing an opposite polarity output, are also possible and may be useful.) Output node 102 may be connected to an internal node of an integrated circuit, or optionally to an external output pad.

Figure 3B:
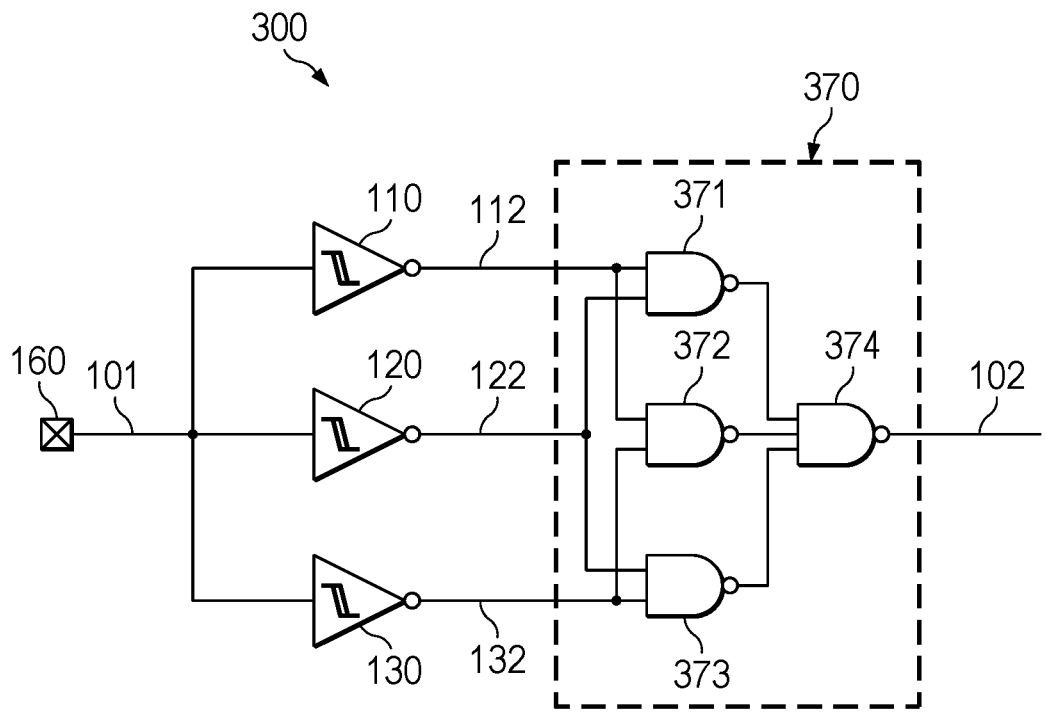
FIG. 3B is a schematic circuit diagram of a triple modular redundant Schmitt threshold circuit showing one embodiment of a digital majority voter circuit.

In FIG. 3B, a schematic circuit diagram or digital logic diagram shows one possible exemplary embodiment of a three-input digital majority voter 370 implemented using two-input NAND gates 371, 372, and 373, and three-input NAND gate 374. This circuit performs the digital majority function just described using all NAND gates. The two inputs of NAND 371 are connected to outputs 112 and 122 of threshold circuits 110 and 120; the two inputs of NAND 372 are connected to outputs 112 and 132 of threshold circuits 110 and 130; and the two inputs of NAND 373 are connected to outputs 122 and 132 of threshold circuits 120 and 130; while the outputs of NAND gates 371, 372, and 373 are connected to the three inputs of NAND 374, and the output of NAND 374 serves as the output of digital majority voter 370, which is connected to output node 102. It is known to those skilled in the art that alternative arrangements of logic gates, such as a combination of AND and OR gates, or all NOR gates, may also be used in alternative embodiments to implement a digital majority voting function in voter 370.

Figure 4A:
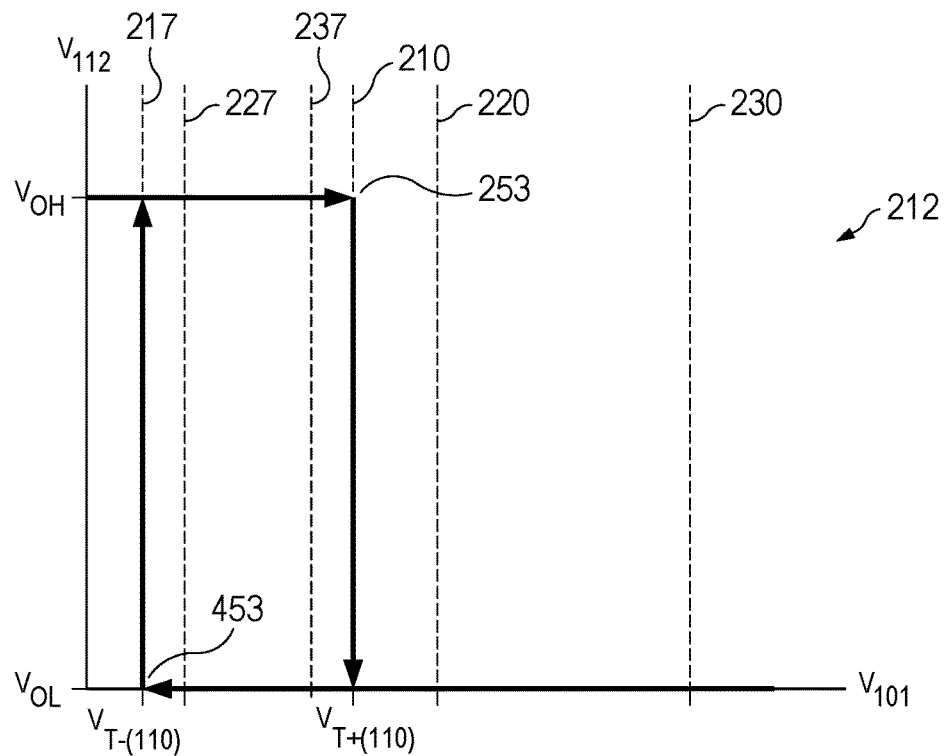
FIGS. 4A-4D are plots of output vs. input voltage characteristics used to describe the operation of a triple modular redundant Schmitt threshold circuit using a digital majority voter as shown in FIG. 3A or 3B.
Figure 4B:
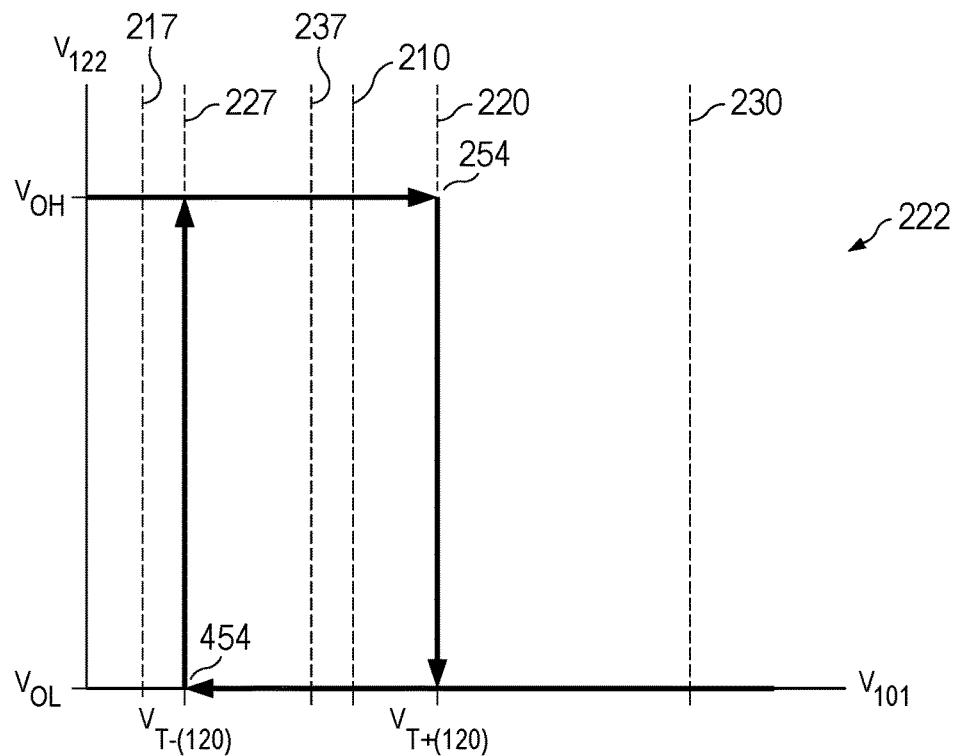
Figure 4C:
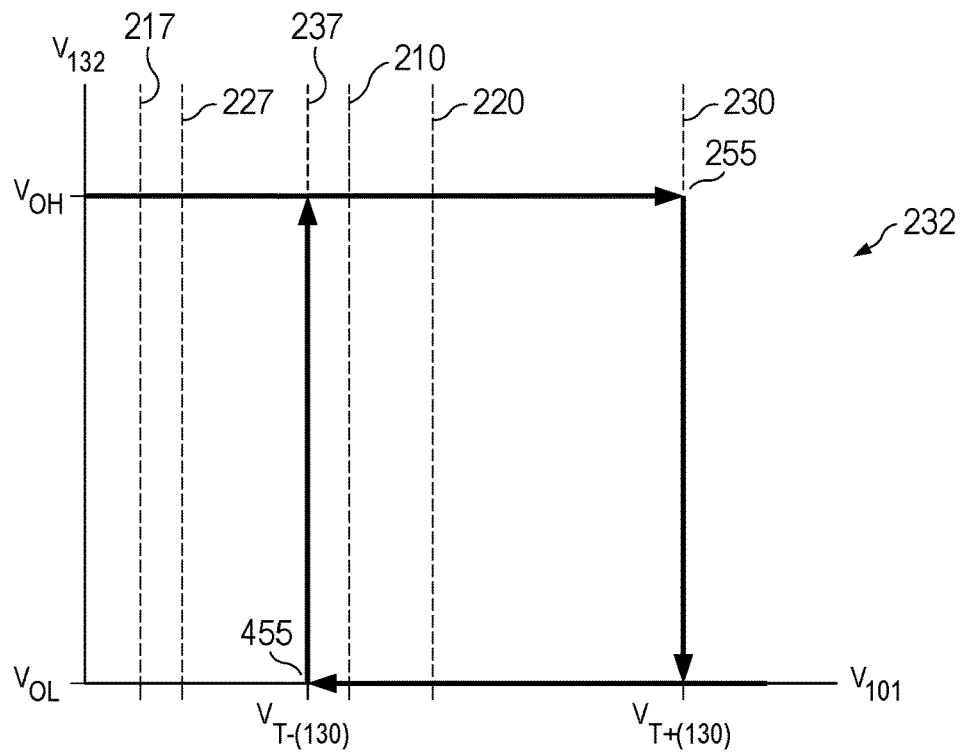
Figure 4D:
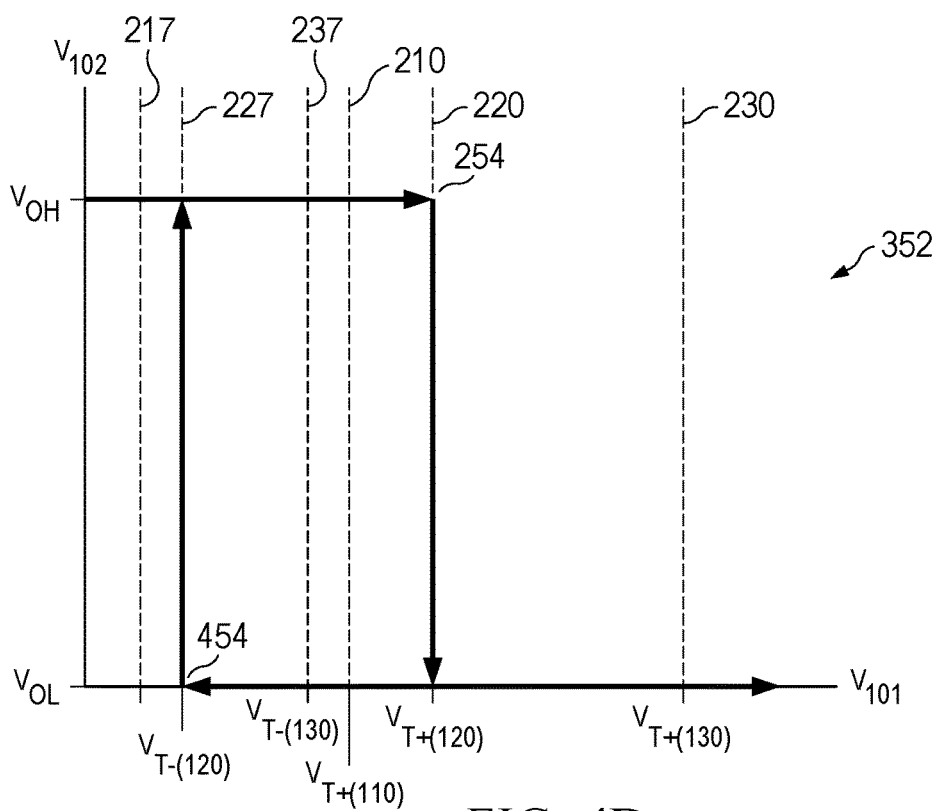

An example of how using a digital majority voter 370 produces well-defined logic levels with hysteretic behavior in circuit 300, in which the threshold circuits are Schmitt trigger inverters, is illustrated in FIGS. 4A-4D, which are plots analogous to those of FIGS. 2A-2D, but now with additional vertical dashed lines 217, 227, and 237, associated respectively with the negative-going thresholds $V_{T-(110)}$ of Schmitt inverter 110, $V_{T-(120)}$ of Schmitt inverter 120, and $V_{T-(130)}$ of Schmitt inverter 130. In fact, except for these additional lines to direct attention to the negative-going thresholds, FIGS. 2A-2C are identical to FIGS. 4A-4C; that is, both FIG. 4A and FIG. 2A plot the same response 212 of independent Schmitt inverter 110; both FIG. 4B and FIG. 2B plot the same response 222 of independent Schmitt inverter 120; and both FIG. 4A and FIG. 2A plot the same response 232 of independent Schmitt inverter 130. Vertical dashed lines 210, 220, and 230 still mark the positive-going threshold voltages, and their positions are the same, as are the positions of the transition points: 253 and 453 for Schmitt inverter 110; 254 and 454 for Schmitt inverter 120; and 255 and 455 for Schmitt inverter 130. However, a plot 352 of the overall input-output characteristic of modular redundant threshold circuit 300 using digital majority voter 370 in FIG. 4D shows a clean hysteresis curve having a single positive-going threshold and a single negative-going threshold. Digital majority voter 370 ensures that output 102 changes state only at a point where the second of three Schmitt inverters changes its output (i.e., as soon as a majority of the three threshold circuits is reached). Since, in this example, both positive-going and negative-going thresholds of Schmitt inverter (threshold circuit) 120 are between the corresponding thresholds of the other threshold circuits 110 and 130, it happens that the hysteresis curve 352 in FIG. 4D looks the same as curve 222 for threshold circuit 120 in FIG. 4B (and FIG. 2B), having the same positive-going threshold 220 ($V_{T+(120)}$) and negative-going threshold 227 ($V_{T-(120)}$), and the same transition points 254 and 454, as the thresholds and transition points for threshold circuit 120 were it connected only to a high-impedance input of digital majority voter 370 (effectively unloaded in circuit 300, in comparison to its application using analog majority voter 170 in circuit 100). A different order of threshold voltages for the three threshold circuits would result in a different overall hysteresis curve having different values for the positive-going and negative-going thresholds, but still desirably exhibiting single thresholds and transition points in both directions. Similar clean hysteresis curves are obtained for N>3, since an overall output transition only occurs when a majority of the threshold circuits reaches the same state.

Figure 5:
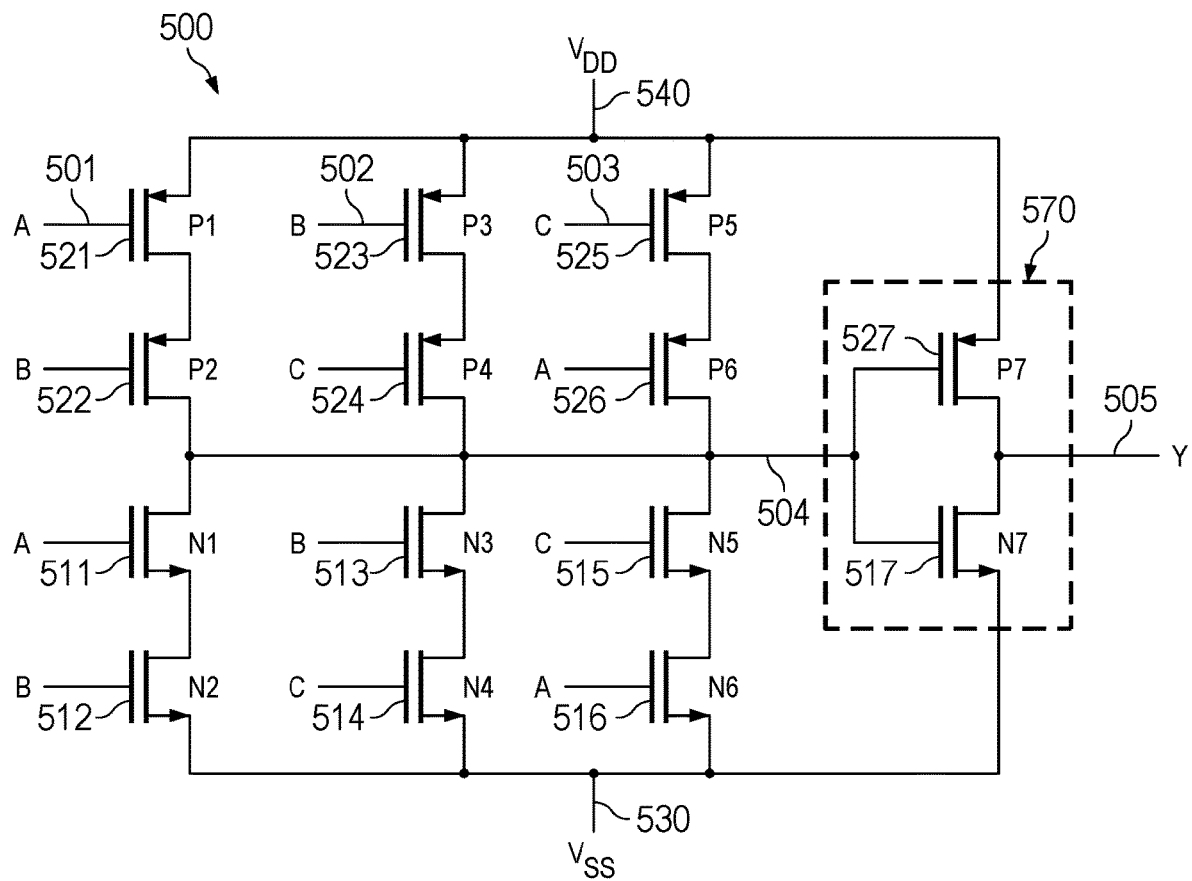
FIG. 5 shows a schematic circuit diagram of a CMOS digital majority voter with the Boolean equation that it implements and the corresponding truth table.

Referring now to FIG. 5, a schematic circuit diagram is shown of an exemplary CMOS digital majority voter circuit 500 that implements a majority function for three logic inputs 501 (A), 502 (B), and 503 (C). Series pairs of PMOS transistors 521 (P1) and 522 (P2), 523 (P3) and 524 (P4), 525 (P5) and 526 (P6), and NMOS transistor pairs 511 (N1) and 512 (N2), 513 (N3) and 514 (N4), 515 (N5) and 516 (N6), are connected as shown, with input 501 (A) connected to the gates of 511 (N1), 521 (P1), 516 (N6), and 526 (P6), input 502 (B) connected to the gates of 512 (N2), 522 (P2), 513 (N3), and 523 (P3), and input 503 (C) connected to the gates of 514 (N4), 524 (P4), 515 (N5), and 525 (P5). The sources of PMOS transistors 521 (P1), 523 (P3), and 525 (P5) are connected to positive supply node 540 ($V_{DD}$), and the sources of NMOS transistors 512 (N2), 514 (N4), and 516 (N6) are connected to negative supply node 530 ($V_{SS}$). The drains of PMOS transistors 522 (P2), 524 (P4), and 526 (P6), as well as the drains of NMOS transistors 511 (N1), 513 (N3), and 515 (N5) are connected together and to a common intermediate output node 504 that could serve as an inverted majority output Y_BAR. Each series "column" of transistors, for example leftmost column 511 (N1), 512 (N2), 521 (P1), and 522 (P2) effectively functions as a two-input NAND gate for a pair of inputs—e.g., in the leftmost column, for inputs 501 (A) and 502 (B); and the interconnection at intermediate output node 504 operates as a three-input AND gate. Inverted majority output 504 can be inverted again by CMOS inverter 570 consisting of transistors 517 (N7) and 527 (P7) to provide a noninverted majority output 505 (Y). The circuit implements the logic represented by Boolean equation 551, specifically Y=(A AND B) OR (B AND C) OR (A AND C), and the truth table 552 is also shown generating both noninverted output 505 (Y) and inverted output 504 (Y_BAR).

Figure 6:
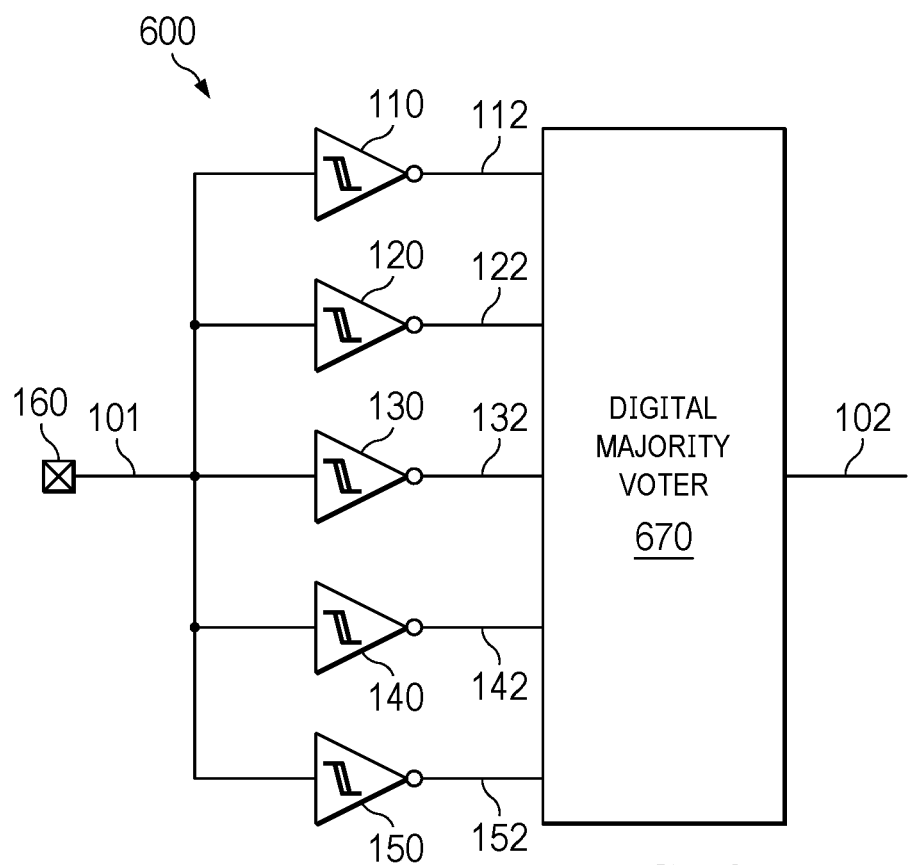
FIG. 6 is a schematic circuit diagram of a 5-modular redundant Schmitt threshold circuit.

FIG. 6 is a schematic circuit diagram of a quintuple (5-modular) redundant Schmitt threshold circuit 600. In this embodiment, five redundant threshold circuits (Schmitt inverters) 110, 120, 130, 140, and 150 are all driven by common input 101 (connected to optional input pad 160), and their respective threshold circuit outputs 112, 122, 132, 142, and 152 are all connected to separate respective inputs of five-input digital majority voter 670, which supplies an output signal 102 implementing the majority function either to an internal IC node or to an optional output pad for external connection (not shown). For five-input majority voter 670, the output will be HIGH if three or more of its inputs are HIGH, that is, three or more of threshold circuits 110, 120, 130, 140, and 150 have HIGH output signals 112, 122, 132, 142, and 152. In general, an N-modular redundant threshold circuit, i.e., having N redundant threshold circuits and an N-input majority voter, will provide a correct output as long as floor[(N−1)/2] or fewer of the N threshold circuits are presenting erroneous inputs to majority voter circuit 670, and the majority voter 670 itself is operating properly. The complexity, i.e., the required number of transistors in the internal circuitry of digital majority voters having higher numbers of inputs increases more rapidly than linearly as the number of inputs increases. Thus, for some configurations, a digital majority voter circuit may require more transistors to implement than N redundant threshold circuits, favoring modular redundant threshold circuits with smaller values for N. Error and failure probabilities due to threshold circuits and majority voter components can be used to calculate an optimum tradeoff between overall circuit complexity, its reliability, and its capability to correct errors.

In some embodiments, an optional fault detection circuit may be included with a modular redundant threshold circuit according to the present invention. This fault detection circuit may, for example, be integrated with embodiments incorporating digital majority voting such as modular redundant threshold circuits 300 and 600. Using circuit 600 of FIG. 6 as an example, an optional fault detection circuit (not shown) may be connected to a subset of signals including input 101, threshold circuit outputs 112, 122, 132, 142, and 152, and nodes within digital majority voter 670, may process these signals using combinational logic, and may possibly latch a subset of the input and output signals, in order to provide a diagnostic signal indicating that an error is occurring, or has previously occurred. Such errors may arise in one or more of the threshold circuits 110, 120, 130, 140, or 150, or within digital majority voter circuit 670, due to SETs or other failures. The diagnostic signal may be configured to provide a simple binary indication of the occurrence of an error (past or present); or multiple diagnostic signal output bits may be generated by the fault detection circuit, and used to signify not only the occurrence, but also to localize and indicate the origin of such an error.

Errors in redundant threshold circuits can be corrected by a majority voting operation, but digital majority voters in particular may be susceptible themselves to errors caused by single-event transients or other failure. Therefore, a further level of redundancy can be added to perform a majority voting operation on the outputs of redundant digital majority voters in order to eliminate a single point of failure in the majority voter. An example embodiment of a triple modular redundant threshold circuit 700 having enhanced resilience by using redundant majority voters is shown in the schematic circuit diagram of FIG. 7. In this embodiment, three redundant digital majority voters 370, 380, and 390 each vote on the output signals 112, 122, and 132 from the triple-redundant threshold circuits (in this example, Schmitt inverters 110, 120, and 130), and the three respective outputs 375, 385, and 395 of digital majority voters 370, 380, and 390 are themselves voted upon by analog majority voter 770 comprising summing node 772 connected to output node 102. Optional buffers 710, 720, and 730 may be included to enhance the analog voting operation fidelity, by improving the output drive characteristics of digital majority voter outputs 375, 385, and 395 in order to generate stronger output signals 712, 722, and 732, respectively. Analog majority voter 770 is relatively immune to SETs, for the reasons discussed with reference to FIG. 1, while adding little complexity to circuit 700. Output node 102 may be an interior node of an integrated circuit, or optionally connected to an output pad (or input/output I/O pad) 165 for use, e.g., in a standalone integrated circuit. It is preferable to use separate (and thus effectively redundant) buffers 710, 720, and 730 to drive an output pad 165, rather than to insert a single buffer in between summing node 772 and output node 102, in order to avoid having such a single buffer be a single point of failure susceptible, e.g., to SETs.

Figure 7:
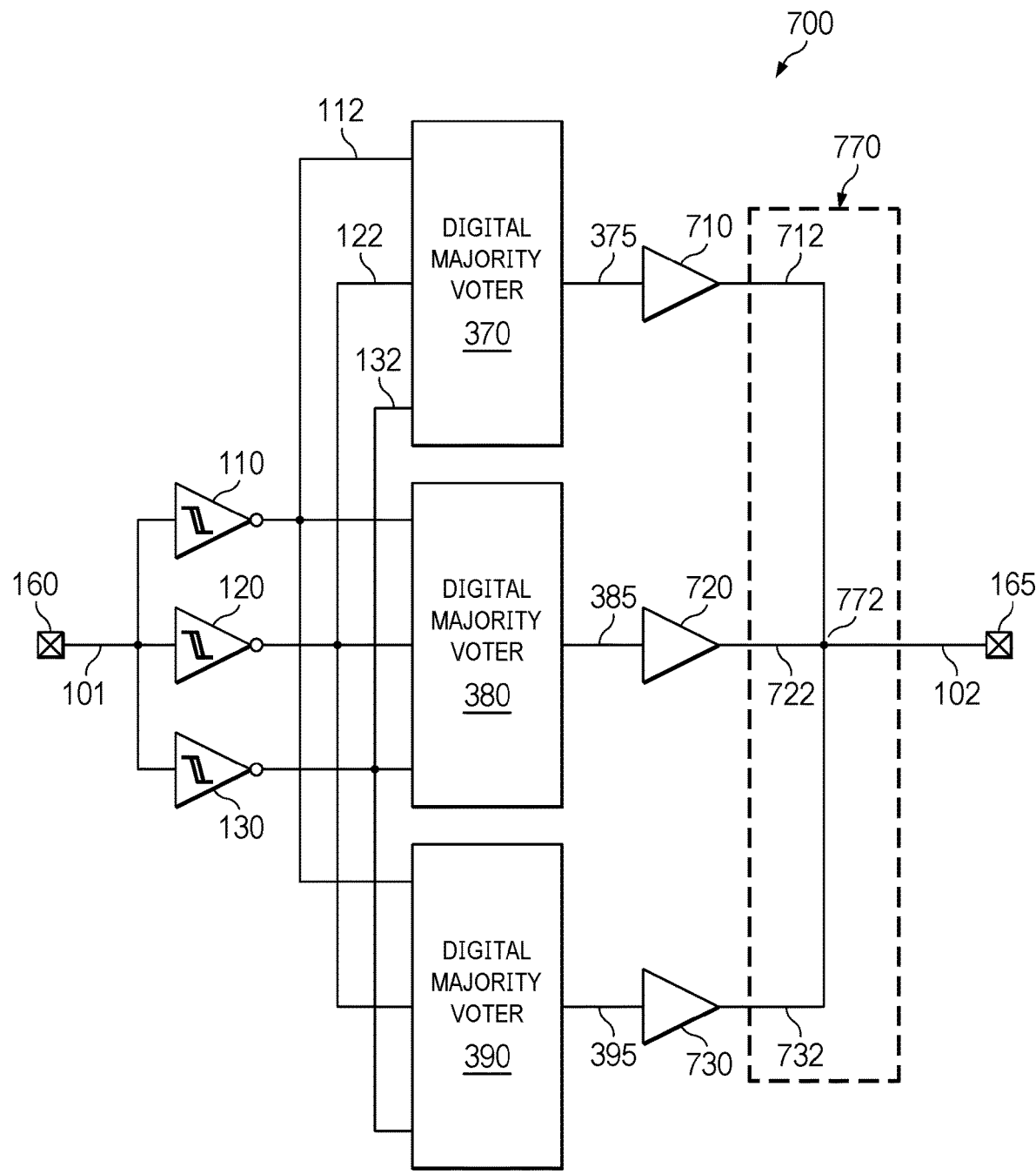
FIG. 7 is a schematic circuit diagram of a triple modular redundant Schmitt threshold circuit using redundant digital majority voters to eliminate single points of failure.

Although the number of digital majority voters M in circuit 700 is shown as three in this example, i.e., having the same number of digital majority voters as threshold circuits such that M=N=3, it is not necessary for the number of digital majority voters M to equal the number of redundant threshold circuits N. The illustrated example in FIG. 7 shows a minimal configuration to accomplish redundancy of threshold circuits as well as redundancy of digital majority voters without the possibility of ties occurring. Analog majority voter 770 has the same number of inputs M as the number of digital majority voters, each of which has a single output. In general, either or both of a larger number N than three of threshold circuits (with a corresponding larger number of inputs for each digital majority voter) or a larger number M than three of digital majority voters may be used. Using a larger number N of threshold circuits rapidly increases the complexity of each digital majority voter, while reducing the probability of simultaneous errors arising in the threshold circuits. Increasing the number M of digital majority voters improves the resilience of the analog majority operation to a single error in a digital majority voter, without significantly increasing the complexity of analog majority voter 770 or its susceptibility to single-event effects.

Circuit realizations of embodiments of the present invention may be implemented within an integrated circuit comprising a semiconductor substrate, a functional circuit comprising at least one modular redundant threshold circuit embodying the majority voting principles and circuits described herein, and at least one pad usable for connection to external circuitry.

It will be appreciated that the various circuit embodiments described herein are exemplary hardware realizations of a method for generating a correct output logic signal that is resilient to errors such as SETs, in response to an input signal to be analyzed by a threshold circuit. In the method, an input signal is provided, that for example may be an analog or corrupted digital signal. A number N equal to three or more redundant threshold circuits, each having an input and producing an individual output signal in response to a signal at its input, are provided, and the input signal is applied simultaneously (i.e., in parallel) to the inputs of each of the N threshold circuits. A majority voting operation is performed on the individual output signals of the threshold circuits to generate the output logic signal. Embodiments in which the majority voting operation is an analog majority voting operation, a digital majority voting operation, or a combination of digital and analog majority voting operations are comprehended within the scope of the invention.

Circuits and methods provided by the present invention may be implemented by applying these designs and methods in high-performance commercial IC processes and can provide increased radiation tolerance without requiring the use of specialized rad-hard fabrication processes. While the present invention has been particularly shown and described in detail in the foregoing specification with reference to specific exemplary embodiments thereof, it will be evident that various modifications and changes may be made thereto without departing from the broader spirit and scope of the invention as set forth in the appended claims. For example, it will be apparent to those skilled in the art that while the present invention has been illustrated using examples from CMOS integrated circuit technology, other IC technologies using different materials and device configurations, or discrete device technologies may be used to implement the inventive principles that are described. Additional components and conventional connections not explicitly drawn or described, such as power supply and bypass connections, any required pull-up resistors or loads or alternative input or output configurations constituting standard practice may be used in implementing embodiments without departing from the scope of the invention. Likewise, integrated circuits according to the present invention may include electrostatic discharge, overvoltage, and/or overcurrent protection circuits among other ancillary circuits in some embodiments.

Furthermore, alternative equivalent embodiments may be implemented using various logic implementations of digital circuits and a variety of analog circuit designs. In addition, combinations of the exemplary embodiments may be made in multiple alternate ways to form more complex devices than illustrated in the figures herein. The specification and drawings are, accordingly, to be regarded in an illustrative rather than a restrictive sense.

We claim:

1. A modular redundant threshold circuit for use in an integrated circuit, comprising:
   an input node;
   a number N of redundant threshold circuits, each having an input and an output, an input of each threshold circuit connected to the input node, wherein the number N is equal to or greater than three;
   a majority voter circuit having voter inputs and a voter output, each of the voter inputs connected to a respective output of one of the N threshold circuits; and
   an output node connected to the voter output and providing an output logic signal,
   whereby errors arising in floor[(N−1)/2] or fewer of the threshold circuits are prevented from producing either an output logic signal that is inconsistent with a majority of the threshold circuit outputs, or from producing an invalid output logic signal.

2. The circuit of claim 1, wherein the number N of threshold circuits is odd.

3. The circuit of claim 1, wherein the threshold circuits comprise Schmitt triggers.

4. The circuit of claim 1, wherein the redundant threshold circuits are selected from the group consisting of a comparator, a comparator with hysteresis, and a clocked comparator.

5. The circuit of claim 1, wherein the input node is connected to an external pad of the integrated circuit.

6. The circuit of claim 1, wherein the output node is connected to an external pad of the integrated circuit.

7. The circuit of claim 1, wherein the threshold circuits have substantially matched output drive capability, and the majority voter circuit comprises an analog majority voter in which the voter inputs are connected together at a summing node that is connected to the voter output.

8. The circuit of claim 1, wherein the majority voter circuit comprises a digital majority voter.

9. The circuit of claim 1, wherein the majority voter circuit comprises M redundant digital majority voters each having N digital voter inputs and an individual digital voter output, and an analog majority voter having M analog voter inputs and an analog voter output, each of the N threshold circuit outputs connected to a respective digital voter input on every digital majority voter, each of the M individual digital voter outputs connected to a respective analog voter input, and the analog voter output connected to the output node, whereby the analog majority voter prevents an output error from occurring due to errors arising in floor$[(M-1)/2]$ or fewer of the digital majority voter circuits.

10. An integrated circuit comprising:
a semiconductor substrate having a surface;
a functional circuit formed on the surface, wherein the functional circuit comprises at least one modular redundant threshold circuit comprising
an input node,
a number N of threshold circuits, each having an input and an output, an input of each threshold circuit connected to the input node, wherein the number N is equal to or greater than three,
a majority voter circuit having voter inputs and a voter output, each of the voter inputs connected to a respective output of one of the N threshold circuits, and
an output node connected to the voter output and providing an output logic signal;
and at least one pad usable for connection to external circuitry,
whereby errors arising in floor$[(N-1)/2]$ or fewer of the threshold circuits are prevented from producing either an output logic signal that is inconsistent with a majority of the threshold circuit outputs, or from producing an invalid output logic signal.

11. The integrated circuit of claim 10, wherein the number N of threshold circuits is odd.

12. The integrated circuit of claim 10, wherein the input node is connected to a pad of the integrated circuit.

13. The integrated circuit of claim 10, wherein the output node is connected to a pad of the integrated circuit.

14. The integrated circuit of claim 10, further comprising a fault detection circuit connected to the modular redundant threshold circuit and configured to provide a diagnostic signal indicating an error occurring in the modular redundant threshold circuit.

15. A method for generating an output logic signal, comprising the steps of:
providing an input signal to be converted into an output logic signal;
providing a number N equal to three or more redundant threshold circuits, each having an input and producing an individual output signal in response to a signal at its input;
applying the input signal substantially simultaneously to the inputs of each of the threshold circuits; and
performing a majority voting operation on the individual output signals of the threshold circuits to generate the output logic signal,
whereby the output logic signal is correctly generated as long as a majority of the threshold circuits produce correct individual output signals.

16. The method of claim 15, wherein the number N of threshold circuits is odd.

17. The method of claim 15, wherein the majority voting operation comprises an analog majority voting operation.

18. The method of claim 15, wherein the majority voting operation comprises a digital majority voting operation.

19. The method of claim 15, wherein the step of performing a majority voting operation comprises providing M digital majority voters, where M is a number equal to three or more, each digital majority voter having N digital majority inputs and a digital majority output, applying the N individual output signals from the threshold circuits to respective inputs on each of the M digital majority voters, and performing an analog majority operation on the M digital majority outputs to generate the output logic signal.

20. The method of claim 19, wherein the number M of digital majority voters is odd.

* * * * *